United States Patent [19]
Tsang

[11] Patent Number: 5,537,112
[45] Date of Patent: Jul. 16, 1996

[54] METHOD AND APPARATUS FOR IMPLEMENTING RUN LENGTH LIMITED CODES IN PARTIAL RESPONSE CHANNELS

[75] Inventor: Kinhing P. Tsang, Plymouth, Minn.

[73] Assignee: Seagate Technology, Inc., Scotts Valley, Calif.

[21] Appl. No.: 180,567

[22] Filed: Jan. 12, 1994

[51] Int. Cl.⁶ .................................................. H03M 7/00
[52] U.S. Cl. ................................................ 341/59; 341/61
[58] Field of Search ........................................ 341/59, 61

[56] References Cited

U.S. PATENT DOCUMENTS 4,544,962  10/1985  Kato ............................................ 360/40
4,707,681  11/1987  Eggenberger.

OTHER PUBLICATIONS

Siegel et al., "Modulation and Coding For Information Storage", *IEEE Communications Magazine*, Dec. 1991, pp. 68–86.

*Primary Examiner*—Jeffrey A. Gaffin
*Assistant Examiner*—Peguy JeanPierre
*Attorney, Agent, or Firm*—Kinney & Lange

[57] ABSTRACT

A method apparatus for encoding segments having a selected number of ordered bits of binary data from a sequence of ordered bits of binary data into corresponding codewords having a selected number of ordered bits of binary data, such that the sequence of ordered bits of binary data is encoded into a sequence of codewords. The apparatus comprises a receiver device for receiving the segments; a separating device for separating the selected number of ordered bits of binary data of each segment into a corresponding first group and a corresponding second group; an encoder mapping device for mapping each first group into a corresponding word having a selected number of ordered bits of binary data; and an interleaving device for interleaving the bits of each corresponding second group with the selected number of ordered bits of binary data of each corresponding word to obtain the corresponding codewords.

20 Claims, 7 Drawing Sheets

Fig. 2

| HEX MS\LS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 112 | 049 | 04A | 04B | 113 | 04D | 04E | 04F | 116 | 069 | 06A | 06B | 117 | 06D | 06E | 06F |
| 1 | 0C9 | 089 | 08A | 08B | 065 | 08D | 08E | 08F | 0E9 | 0A9 | 0AA | 0AB | 0E5 | 0AD | 0AE | 0AF |
| 2 | 0CA | 051 | 052 | 053 | 066 | 055 | 056 | 057 | 0EA | 059 | 05A | 05B | 0E6 | 05D | 05E | 05F |
| 3 | 0CB | 071 | 072 | 073 | 067 | 075 | 076 | 077 | 0EB | 079 | 07A | 07B | 0E7 | 07D | 07E | 07F |
| 4 | 11A | 091 | 092 | 093 | 11B | 095 | 096 | 097 | 11E | 099 | 09A | 09B | 11F | 09D | 09E | 09F |
| 5 | 0CD | 081 | 082 | 083 | 0A5 | 0B5 | 086 | 0B7 | 0ED | 0B9 | 0BA | 0BB | 13A | 0BD | 0BE | 0BF |
| 6 | 0CE | 0D1 | 0D2 | 0D3 | 0A6 | 0D5 | 0D6 | 0D7 | 0EE | 0D9 | 0DA | 0DB | 126 | 0DD | 0DE | 0DF |
| 7 | 0CF | 0F1 | 0F2 | 0F3 | 0A7 | 0F5 | 0F6 | 0F7 | 0EF | 0F9 | 0FA | 0FB | 127 | 0FD | 0FE | 0FF |
| 8 | 12A | 149 | 14A | 14B | 12B | 14D | 14E | 14F | 12E | 169 | 16A | 16B | 12F | 16D | 16E | 16F |
| 9 | 1C9 | 189 | 18A | 18B | 165 | 18D | 18E | 18F | 1E9 | 1A9 | 1AA | 1AB | 1E5 | 1AD | 1AE | 1AF |
| A | 1CA | 151 | 152 | 153 | 166 | 155 | 156 | 157 | 1EA | 159 | 15A | 15B | 1E6 | 15D | 15E | 15F |
| B | 1CB | 171 | 172 | 173 | 167 | 175 | 176 | 177 | 1EB | 179 | 17A | 17B | 1E7 | 17D | 17E | 17F |
| C | 132 | 191 | 192 | 193 | 133 | 195 | 196 | 197 | 136 | 199 | 19A | 19B | 137 | 19D | 19E | 19F |
| D | 1CD | 1B1 | 1B2 | 1B3 | 1A5 | 1B5 | 1B6 | 1B7 | 1ED | 1B9 | 1BA | 1BB | 13B | 1BD | 1BE | 1BF |
| E | 1CE | 1D1 | 1D2 | 1D3 | 1A6 | 1D5 | 1D6 | 1D7 | 1EE | 1D9 | 1DA | 1DB | 13E | 1DD | 1DE | 1DF |
| F | 1CF | 1F1 | 1F2 | 1F3 | 1A7 | 1F5 | 1F6 | 1F7 | 1EF | 1F9 | 1FA | 1FB | 13F | 1FD | 1FE | 1FF |

| HEX LS/MS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 00 | 122 | 89 | 8A | 8B | 123 | 8D | 8E | 8F | 322 | A9 | AA | AB | 323 | AD | AE | AF |
| 01 | 129 | C9 | CA | CB | A5 | CD | CE | CF | 329 | E9 | EA | EB | 2A5 | ED | EE | EF |
| 02 | 12A | 189 | 18A | 18B | A6 | 18D | 18E | 18F | 32A | 1A9 | 1AA | 1AB | 2A6 | 1AD | 1AE | 1AF |
| 03 | 12B | 1C9 | 1CA | 1CB | A7 | 1CD | 1CE | 1CF | 32B | 1E9 | 1EA | 1EB | 2A7 | 1ED | 1EE | 1EF |
| 04 | 162 | 91 | 92 | 93 | 163 | 95 | 96 | 97 | 362 | 99 | 9A | 9B | 363 | 9D | 9E | 9F |
| 05 | 12D | B1 | B2 | B3 | E5 | B5 | B6 | B7 | 32D | 89 | BA | BB | 2E5 | BD | BE | BF |
| 06 | 12E | D1 | D2 | D3 | E6 | D5 | D6 | D7 | 32E | D9 | DA | DB | 2E6 | DD | DE | DF |
| 07 | 12F | F1 | F2 | F3 | E7 | F5 | F6 | F7 | 32F | F9 | FA | FB | 2E7 | FD | FE | FF |
| 08 | 1A2 | 111 | 112 | 113 | 1A3 | 115 | 116 | 117 | 3A2 | 119 | 11A | 11B | 3A3 | 11D | 11E | 11F |
| 09 | 149 | 131 | 132 | 133 | 1A5 | 135 | 136 | 137 | 349 | 139 | 13A | 13B | 3A5 | 13D | 13E | 13F |
| 0A | 14A | 151 | 152 | 153 | 1A6 | 155 | 156 | 157 | 34A | 159 | 15A | 15B | 3A6 | 15D | 15E | 15F |
| 0B | 14B | 171 | 172 | 173 | 1A7 | 175 | 176 | 177 | 34B | 179 | 17A | 17B | 3A7 | 17D | 17E | 17F |
| 0C | 1E2 | 191 | 192 | 193 | 1E3 | 195 | 196 | 197 | 3E2 | 199 | 19A | 19B | 3E3 | 19D | 19E | 19F |
| 0D | 14D | 1B1 | 1B2 | 1B3 | 1E5 | 1B5 | 1B6 | 1B7 | 34D | 1B9 | 1BA | 1BB | 3E5 | 1BD | 1BE | 1BF |
| 0E | 14E | 1D1 | 1D2 | 1D3 | 1E6 | 1D5 | 1D6 | 1D7 | 34E | 1D9 | 1DA | 1DB | 3E6 | 1DD | 1DE | 1DF |
| 0F | 14F | 1F1 | 1F2 | 1F3 | 1E7 | 1F5 | 1F6 | 1F7 | 34F | 1F9 | 1FA | 1FB | 3E7 | 1FD | 1FE | 1FF |

|    | 0  | 1   | 2   | 3   | 4   | 5   | 6   | 7   |    | 8   | 9   | A   | B   | C   | D   | E   | F   |
|----|----|-----|-----|-----|-----|-----|-----|-----|----|-----|-----|-----|-----|-----|-----|-----|-----|
| 10 | 222| 289 | 28A | 28B | 223 | 28D | 28E | 28F |    | 226 | 2A9 | 2AA | 2AB | 227 | 2AD | 2AE | 2AF |
| 11 | 169| 2C9 | 2CA | 2CB | 125 | 2CD | 2CE | 2CF |    | 369 | 2E9 | 2EA | 2EB | 325 | 2ED | 2EE | 2EF |
| 12 | 16A| 389 | 38A | 38B | 126 | 38D | 38E | 38F |    | 36A | 3A9 | 3AA | 3AB | 326 | 3AD | 3AE | 3AF |
| 13 | 16B| 3C9 | 3CA | 3CB | 127 | 3CD | 3CE | 3CF |    | 36B | 3E9 | 3EA | 3EB | 327 | 3ED | 3EE | 3EF |
| 14 | 232| 291 | 292 | 293 | 233 | 295 | 296 | 297 |    | 236 | 299 | 29A | 29B | 237 | 29D | 29E | 29F |
| 15 | 16D| 2B1 | 2B2 | 2B3 | 165 | 2B5 | 2B6 | 2B7 |    | 36D | 2B9 | 2BA | 2BB | 365 | 2BD | 2BE | 2BF |
| 16 | 16E| 2D1 | 2D2 | 2D3 | 166 | 2D5 | 2D6 | 2D7 |    | 36E | 2D9 | 2DA | 2DB | 366 | 2DD | 2DE | 2DF |
| 17 | 16F| 2F1 | 2F2 | 2F3 | 167 | 2F5 | 2F6 | 2F7 |    | 36F | 2F9 | 2FA | 2FB | 367 | 2FD | 2FE | 2FF |
|    |    |     |     |     |     |     |     |     |    |     |     |     |     |     |     |     |     |
| 18 | 262| 311 | 312 | 313 | 263 | 315 | 316 | 317 |    | 266 | 319 | 31A | 31B | 267 | 31D | 31E | 31F |
| 19 | 22A| 331 | 332 | 333 | 22B | 335 | 336 | 337 |    | 22E | 339 | 33A | 33B | 22F | 33D | 33E | 33F |
| 1A | 23A| 351 | 352 | 353 | 23B | 355 | 356 | 357 |    | 23E | 359 | 35A | 35B | 23F | 35D | 35E | 35F |
| 1B | 24A| 371 | 372 | 373 | 24B | 375 | 376 | 377 |    | 24E | 379 | 37A | 37B | 24F | 37D | 37E | 37F |
| 1C | 272| 391 | 392 | 393 | 273 | 395 | 396 | 397 |    | 276 | 399 | 39A | 39B | 277 | 39D | 39E | 39F |
| 1D | 25A| 3B1 | 3B2 | 3B3 | 25B | 3B5 | 3B6 | 3B7 |    | 25E | 3B9 | 3BA | 3BB | 25F | 3BD | 3BE | 3BF |
| 1E | 26A| 3D1 | 3D2 | 3D3 | 26B | 3D5 | 3D6 | 3D7 |    | 26E | 3D9 | 3DA | 3DB | 26F | 3DD | 3DE | 3DF |
| 1F | 27A| 3F1 | 3F2 | 3F3 | 27B | 3F5 | 3F6 | 3F7 |    | 27E | 3F9 | 3FA | 3FB | 27F | 3FD | 3FE | 3FF |

METHOD AND APPARATUS FOR IMPLEMENTING RUN LENGTH LIMITED CODES IN PARTIAL RESPONSE CHANNELS

BACKGROUND OF THE INVENTION

The present invention relates in general to information storage systems, and more particularly, to a method and apparatus for implementing run length limited codes in partial response channels in a digital magnetic recording system.

In digital magnetic recording systems, data is recorded in a moving magnetic media layer by a storage, or "write" electrical current-to-magnetic field transducer, or "head", positioned immediately adjacent thereto. The data is stored or written to the magnetic media by switching the direction of flow of a substantially constant magnitude write current which flows through windings in the write transducer. Each write current direction transition results in a reversal of the magnetization direction in that portion of the magnetic media just passing by the transducer during current flow in the new direction, with respect to the magnetization direction in the media induced by the previous current flow in the opposite direction. In one scheme, a magnetization direction reversal over a portion of the media moving past the transducer represents a binary digit "1", and the lack of any reversal in that portion represents a binary digit "0".

When data is to be recovered, a retrieval, or "read" magnetic field-to-voltage transducer, (which may be the same as the write transducer if both are inductive) is positioned to have the magnetic media, containing previously stored data, pass thereby such that flux reversal regions in that media either induce, or change a circuit parameter to provide, a voltage pulse to form an output read signal for that transducer. In the scheme described above, each such voltage pulse due to the magnetizations in corresponding media portions represents a binary digit "1" and the absence of a pulse in correspondence with such portions represents a binary digit "0".

In digital magnetic recording systems using peak detection of such voltage pulses as the data recovery method to digitize the read signal, the times between voltage pulses are used to reconstruct the timing information used in recording the data previously stored in the magnetic media to define the path portions described above. More specifically, the output of such a peak detector is used as an input signal to a phase-locked loop forming a controlled oscillator, or phase-lock oscillator (PLO), or synchronizer, which produces an output clock signal from the positions of the detected peaks of the read signal. Absolute time is not used in operating the data retrieval system portion since the speed of the magnetic media varies over time which results in nonuniform time intervals between read signal voltage pulses.

A data encoding scheme known as run-length-limited (RLL) coding is commonly used to improve the PLO's reconstructed clock signal accuracy based on avoiding drift in the frequency thereof because of too much time between voltage read signal pulses. When RLL code is employed, the time durations between read signal voltage pulse transitions is bounded, that is, the number of binary digits of value "0" that can separate binary digits of value "1" in the read signal is limited. This constraint is known overall as a (d,k) constraint where the individual constraint "d" represents the minimum run length of zeros, or the number thereof between ones, while the individual constraint "k" represents the maximum run length of zeros permitted. The "d" portion of the constraint can be chosen so as to avoid crowding of voltage pulses in the read signals which can reduce intersymbol interference problems in which portions of read signal voltage pulses overlap. By limiting the number of consecutive zeros, the "k" constraint maintains the reliability of the PLO in providing an accurate clock signal for the retrieval system. An automatic gain control (AGC) system is used to maintain signal amplitude for the PR4 channel, and the "k" restraint also maintains the reliability of the AGC.

In digital magnetic recording systems employing partial response (PR) signaling, which involves the acceptance of intersymbol interference, data recovery is achieved by periodically sampling the amplitude of the read transducer output signal, as initiated by clock pulses of the PLO, to digitize that signal. In this scheme, each clock pulse of the PLO initiates a sample which has value contributed to it by more than one pulse in the transducer read signal. Thus, a partial response detection system is designed to accommodate the effects of such intersymbol interference, and therefore the "d" constraint may not be necessary (i.e. d=0). The "k" constraint is still necessary in PR signalling because the PLO is still used to provide timing for sampling the read signal, and because the AGC is used to maintain sample amplitude in connection with the PR channel.

A selected frequency response is chosen for the signal channel through which the read signal passes prior to detection thereof, termed a class 4 response, that is particularly suitable for magnetic recording with typical pulse characteristics because the channel requires very little equalization to achieve an overall match of this class 4 response. In a class 4 PR channel for typical pulse characteristics, signal samples are independent of their immediately neighboring samples, but are dependent on samples 2 clock samples away. Therefore, read samples can be divided into 2 subsequences, one of odd indexed samples and one of even indexed samples. Each such subsequence is submitted independently to a Viterbi Algorithm decoder which generates the data that most likely reproduces the original stored values. To limit the delay and increase the accuracy and reliability of the Viterbi Algorithm decoder, another individual constraint, "i", is incorporated in the RLL code for a class 4 partial response channel. The "i" constraint represents the maximum run length of zeros in each subsequence, and the overall constraint for a class 4 PR channel is denoted as (d, k/i), where "d" and "k" represent the same constraints as mentioned above with respect to (d,k) code, and where "d" is set to zero as indicated above.

In order to satisfy the (d, k/i) constraint, "m" data symbols or bits are mapped into "n" code symbols, where "m" is less than "n". The rate of the code to transmit information bits out of the total bits transmitted is given by the formula r=m/n, and for ease of implementation "m" and "n" are usually chosen to be small integers. Since a unit of 8 bits per byte is widely used in the computer and electronic industry, reasonable choices of "m" are 8 and 16. In order to keep the code rate high, "n" is chosen to be equal to "m+1" and so code rates of 8/9 and 16/17 are popular for class 4 partial response channels.

The "m" data symbols, or binary data bits are mapped into the "n" code symbols, or binary data bits, by selecting $2^m$ different n-bit patterns which satisfy the (d, k/i) constant. Since Boolean logic is used to implement such bit pattern mapping, the larger the "m" and "n" are, the more complex the Boolean logic that is required. In recent years the 8/9 rate for such run length codes has been the most popular rate since it only requires $2^8$ or 256 different 9-bit patterns which satisfy the (0, k/i) constraint which simplifies the encoder and decoder Boolean logic required to implement the pattern mapping. However, the 16/17 rate in such codes is 5.8% higher than the 8/9 rate for encoding a given set of data. In order to develop a rate of 16/17 for a (0, k/i) RLL code using such bit pattern mapping to encode the data symbols, there is needed $2^{16}$ or 65,536 17-bit patterns which must satisfy the (0, k/i) constraint. This large number of possible 17-bit codeword combinations requires very complex, and thus undesirable, encoder and decoder logic, compared to the rate 8/9 RLL code. Thus, it would be desirable to provide a 16/17 rate RLL code which is easier to implement than one otherwise obtained through pattern mapping $2^{16}$ possible 17-bit code symbol or codeword combinations.

SUMMARY OF THE INVENTION

The present invention relates to a method and apparatus for implementing run length limited codes for partial response channels employing maximum likelihood detection. The present invention relates to an apparatus for encoding data segments having therein a selected number of ordered bits of binary data obtained from a sequence of ordered bits of binary data. These data segments are encoded into corresponding codewords having a selected number of ordered bits of binary data such that the sequence of ordered bits of binary data is encoded into a corresponding sequence of codewords. The apparatus comprises receiver means for receiving the data segments, separating means for separating the selected number of ordered bits of binary data of each segment into a corresponding first group and a corresponding second group, encoder mapping means for mapping the first group into a corresponding word having a selected number of ordered bits of binary data, and interleaving means for interleaving the bit of each corresponding second group with the selected number of ordered bits of binary data of each corresponding word to obtain the corresponding codewords. Each such codeword has no more than a first pre-selected number of consecutive zeros therein. Adjacent ones of these codewords in the sequence of codewords have no more than the first pre-selected number of consecutive zeros bridging across the boundary between them. Each such codeword comprises two subsequences, one of these subsequence consisting only of every other bit of the selected number of ordered bits of binary data of the codeword and the other subsequence consisting only of the remaining bits. Each of the subsequences has no more than a second pre-selected number of consecutive zeros therein. Adjacent ones of these subsequences of codewords within the sequence of codewords have no more than the second pre-selected number of zeros bridging across the boundary between them.

Run length limited codes under the present invention are suitable for partial response channels for which Viterbi detection is employed in decoding transmissions therethrough, and which are characterized by d, k, and i constraints. According to the present invention, the alternative overall constraints provided for a RLL code having a 16/17 rate are (0, 8/6) and (0, 6/6). The present invention is characterized by sequential Boolean logic equations and look-up tables for encoding and decoding 16/17 rate RLL codes having these constraints. Although the present invention is particularly related to partial response maximum likelihood detection code constraints for use in magnetic recording of digital data in disc memory devices, the code constraints and the equations for encoding and decoding data in accordance herewith are applicable to any PR signalling system including magnetic-optic and optical recording systems.

BRIEF DESCRIPTION OF THE DRAWINGS

FIG. 2 is a table of 256 hexadecimal numbers equivalent to 9-bit binary sequences for 8/9 rate RLL code for use in deriving a 16/17 rate RLL code under a (0, 8/6) constraint in accordance with the principals of the present invention;

FIG. 3 is a diagram of the table of FIG. 2 showing a partition grouping pattern for a 16/17 rate RLL code under a (0, 8/6) constraint;

FIGS. 5A and 5B are tables of 512 hexadecimal numbers equivalent to 10-bit binary sequences for 9/10 rate RLL code for use in deriving a 16/17 rate RLL code under a (0, 6/6) constraint in accordance with the principals of the present invention; and FIG. 6 is a diagram of the table of FIG. 4 showing a partition grouping pattern for a 16/17 rate RLL code under a (0, 6/6) constraint.

DETAILED DESCRIPTION OF THE PREFERRED EMBODIMENTS

Figure 1:
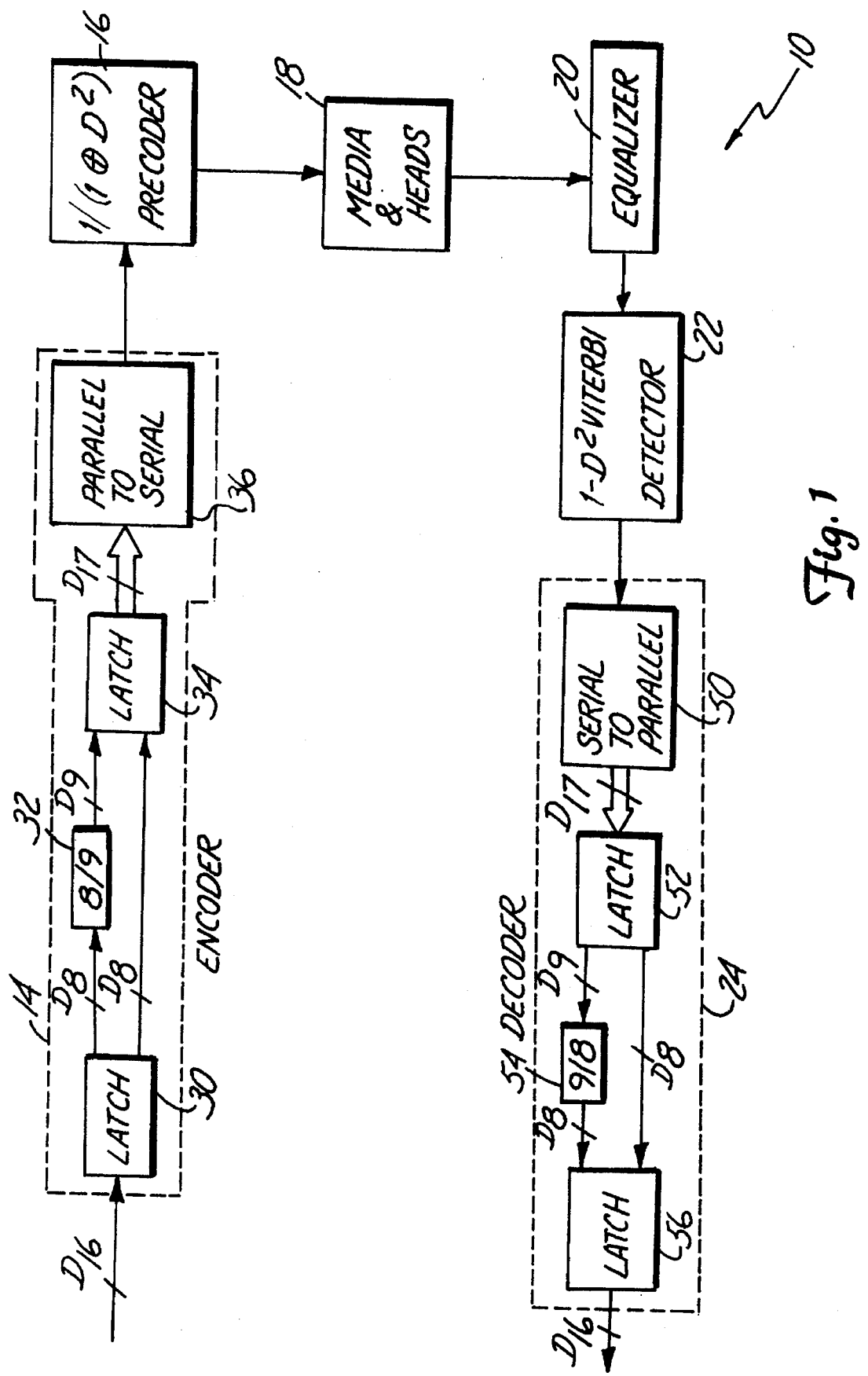
FIG. 1 is a block diagram of a system employing a 16/17 rate RLL code modulation scheme under a (0, 8/6) constraint in accordance with the principals of the present invention.

Referring to FIG. 1, a magnetic recording storage and retrieval system 10 utilizes a 16/17 rate RLL code scheme for writing bits of coded binary data to magnetic media in system 10 from a binary data stream received from a storage using system (not shown), system 10 thereafter permitting selective reading of such data therefrom. The original sequence binary data is considered as groups of 16 bits of data, such a group being denoted $D_{16}$ in FIG. 1, and the encoded data is represented by a corresponding group of 17 bits of data denoted $D_{17}$ in that figure. System 10 includes an encoder 14 for receiving and encoding the groups of ordered bits of binary data into corresponding codewords, a precoder 16, having a $1/(1 \oplus D^2)$ transfer function suitable for use with a class 4 partial response (PR 4) read signal channel to aid in the subsequent decoding of the data sent therethrough. This partial response read signal channel is formed by the magnetic media, the heads used for reading and writing the encoded data to and from the media (the media and head together form a structure denoted by the reference number 18) and an equalizer 20. The PR4 signal channel, if formed by head structure 18 and equalizer 20, has the desired $1-D^2$ class 4 response. A Viterbi algorithm detector 22 determines, from the read signal provided by the read head in media and head structure 18, the most likely sequence of recorded data codewords which produced that read signal. These results are provided to a decoder 24 for receiving and decoding the sequences of codewords to obtain the original ordered bits of binary data.

In accordance with the present invention, an RLL code having a 16/17 rate and a (0, 8/6) overall (d,k/i) constraint is derived from an RLL code having an 8/9 rate as will be explained below, to provide a simpler way of encoding and decoding received data into a 16/17 rate RLL code than by mapping the data groups received into corresponding ones of $2^{16}$ different 17-bit codeword patterns. The encoder 14 includes an input latch 30, an 8/9 encoder 32, an output latch 34, and a parallel-to-series converter 36. A sequence of binary data bits from some system making use of recording system 10, which data may have been previously encoded for other purposes, is supplied to input latch 30 in encoder 14. These data bits are synchronously entered therein 8 bits (1 byte) of binary data at a time by a clocking signal supplied from an electronic clock oscillator (not shown) based on a phase-lock loop provided elsewhere in system 10 as described above. After 16 bits (two bytes) of binary have been clocked into input latch 30, the 16 bits of binary data are treated as being grouped into a first group of 8 bits, here denoted byte A, and a second group of 8 bits, here denoted byte B, wherein:

$$A \triangleq [A_7, A_6, A_5, A_4, A_3, A_2, A_1, A_0], \quad (1)$$

$$B \triangleq [B_7, B_6, B_5, B_4, B_3, B_2, B_1, B_0]. \quad (2)$$

The logic gates in 8/9 encoder 32 perform certain logic functions (given below) on byte A that effectively "maps" byte A into a 9-bit initial codeword, C, wherein:

$$C \triangleq [C_8, C_7, C_6, C_5, C_4, C_3, C_2, C_1, C_0], \quad (3)$$

following the requirements for the selected run length constraint (0,8/6). Output latch 34 interleaves 9-bit word C with byte B to form a 17-bit codeword, W, which satisfies the (0, 8/6) overall constraint and which is denoted as:

$$W \triangleq [C_8, B_7, C_7, B_6, C_6, B_5, C_5, B_4, C_4, B_3, B_2, C_3, B_1, C_2, C_1, B_0, C_0]. \quad (4)$$

Parallel-to-series converter 36 serially provides the 17 bits of the codeword W to the precoder 16 which, in turn, provides a further coded version of them to the media portion of media and head structure 18.

The encoded data (codewords W) can thereafter be selectively read as desired from this media to form a read signal which passes through the rest of the PR 4 signal channel, as maintained by equalizer 20, to reach Viterbi algorithm detector 22. Precoder 16, media and head structure 18, equalizer 20, Viterbi algorithm detector 22, input latch 30, output latch 34 and parallel-to-serial converter 36 are well known components to those skilled in the art. Those skilled in the art will recognize that there are many ways to configure digital magnetic recording system 10, but the present invention is directed to the encoding scheme established by the logic structure of encoder 14 which uses a relatively simple technique to provide RLL coding of incoming data at an information symbol rate of 16/17 through interleaving the 9 code bits of word C with the data bits of byte B to form codeword W.

Each codeword W includes two subsequences of alternating bits, wherein a first subsequence, $W_1$, consists only of every other bit in a codeword W, and the second subsequence, $W_2$, consists of the remaining bits of that codeword W. Typically, the first subsequence, $W_1$, is denoted as an odd sequence because of having therein the bits from the odd numbered bit positions in codeword W wherein:

$$W_1 \triangleq [C_8, C_7, C_6, B_5, B_4, B_2, B_1, C_1, C_0]. \quad (5)$$

The remaining bits form the second sequence, $W_2$, which is typically denoted as an even sequence wherein:

$$W_2 \triangleq [B_7, B_6, C_5, C_4, B_3, C_3, C_2, B_0]. \quad (6)$$

It is necessary for proper operation of the system phase-lock loop, as described above, to ensure that within each codeword W, and across the boundary between adjacent codewords W in a sequence thereof, the maximum number of consecutive zeros is 8. Similarly, within each subsequence $W_1$ and $W_2$ and (a) across the boundary between adjacent subsequences $W_1$ in a sequence thereof, and (b) across the boundary between adjacent subsequences $W_2$ in a sequence thereof, the maximum number of consecutive zeros is 6. Also, it is undesirable to constrain the bits of byte B (which would effectively place a constraint on the user system since byte B is not being encoded). Thus, the structure of 8/9 encoder 32 must effectively map byte A into codeword C so, in the worst case scenario (when byte B is all zeros), the codeword W will still satisfy the (0,8/6) constraint mentioned above. Since d=0, the following conditions ensure that the "k" and "i" limits in this constraint are satisfied:

$$C_8 + C_7 + C_6 = 1 \quad (7)$$

$$C_1 + C_0 = 1 \quad (8)$$

$$C_7 + C_6 + C_5 + C_4 = 1 \quad (9)$$

$$C_6 + C_5 + C_4 + C_3 = 1 \quad (10)$$

$$C_5 + C_4 + C_3 + C_2 = 1 \quad (11)$$

$$C_4 + C_3 + C_2 + C_1 = 1 \quad (12)$$

$$C_7 + C_6 + C_1 = 1 \quad (13)$$

$$C_4 + C_3 + (C_5 \cdot C_2) = 1 \quad (14)$$

Equations 7 and 8 above ensure that the k=8 constraint is satisfied at the boundary between adjacent codewords W since a 1 value for any of bits $C_8$, $C_7$, and $C_6$, and bits $C_1$, and $C_0$ of any codeword $W_n$ (see equation 4 above) effectively limits the length of a string of zeros possible over any 8 consecutive bits (assuming the worse case scenario where byte B is all zeros) across the boundary between codeword W and either of adjacent codewords $W_{n\pm1}$. Equations 9–12 ensure that within each codeword W the k=8 constraint is satisfied, since a 1 value for any of bits $C_7$, $C_6$, $C_5$, $C_4$, $C_3$, $C_2$ and $C_1$ of codeword W (again see equation 4 above) effectively limits the length of a string of zeros possible over any 8 consecutive bits (assuming the worst scenario where byte B is all zeros) within each codeword W. Equation 13, in combination with equations 7 and 8, ensures that within each odd subsequence $W_1$, and at the boundary between odd subsequences $W_1$ of codewords adjacent to W, the i=6 constraint is satisfied, since a 1 value for any of bits $C_8$, $C_7$, $C_6$, $C_1$ and $C_0$ of codeword W effectively limits the length of a string of zeros possible over any 6 consecutive bits within any odd subsequence $W_{1:n}$ and over any 6 consecutive bits across the boundary between odd subsequence $W_{1:n}$ and either of adjacent odd subsequences $W_{1n\pm1}$. Equation 14, in combination with equations 1 and 2, ensures that within each even subsequence $W_2$, and at the boundary between even subsequences $W_2$ of codewords adjacent to W, the i=6 constraint is satisfied, since a 1 value for any of bits $C_8$, $C_7$, $C_6$, $C_5$, $C_4$, $C_3$, $C_2$, $C_1$ and $C_0$ of codeword W effectively limit the length of a string of zeros possible over any 6 consecutive bits within any even subsequence $W_{2:n}$, and over any 6 consecutive bits across the boundary between each even subsequence $W_{2:n}$ and either of adjacent even subsequences $W_{2:n\pm1}$.

There are 256 different 9-bit patterns which satisfy the conditions in equations 7–14 which exactly matches the number of all possible 8-bit patterns (i.e. $2^8$). FIG. 2 shows a table representing a one-to-one mapping of any possible value of a byte A, taken as a two-digit hexadecimal number, into the corresponding 9-bit word C taken as a three digit hexadecimal number such that equations 7–14 are satisfied. The bit patterns are shown in hexadecimal form in FIG. 2 for simplicity with the least significant (LS) digit in the byte A hexadecimal number represented in the top line and the most significant (MS) digit represented in the leftmost column of the table of FIG. 2. Thus, 8/9 encoder 32 effectively converts a value of byte A, represented by a digit in the top row and one in the leftmost column of the table in FIG. 2, to the corresponding C word value at the corresponding row and column interaction.

Figure 3:
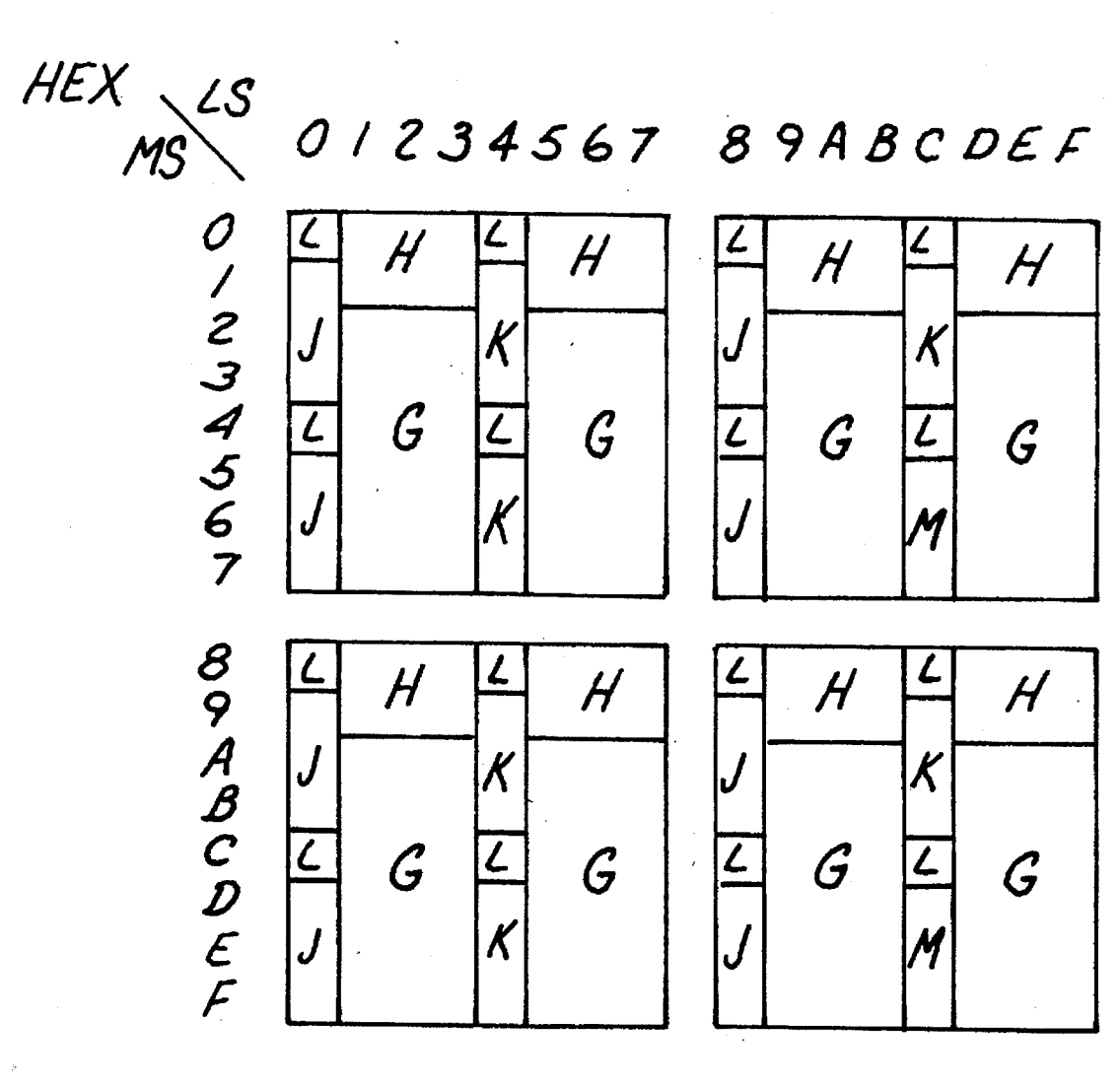

In order to simplify the implementation of the Boolean logic equations of 8/9 encoder 32 based on the table of FIG. 2, the 256 different values for 9-bit initial codeword C shown in the table of FIG. 2 can be grouped by various partitioning schemes, including being grouped into the six partitions thereof shown in FIG. 3. In other words, FIG. 3 is a diagram of the table of FIG. 2 in which the various partitions, denoted by one of the capital letters G, H, J, K, L and M, represent groups of 9-bit C words in Table 2 having a predetermined relationship to each other described below. All of the definitions of logic structure of 8/9 encoder 32 can be expressed in Boolean logic expressions, wherein "·" denotes an AND gate, "+" denotes an OR gate, ⊕ denotes an exclusive OR gate, and "⁻" denotes a NOT gate or logic invertor.

Referring to FIG. 3, the first partition of word assignments, denoted G, comprises the set of data bytes correspondingly shown in FIG. 2 in which the first and last 4 bits of the 8-bit binary data byte A are mapped without change into the first and last 4 bits, respectively, of the 9-bit word C. The middle bit, i.e. the 5th bit position, of the 9-bit word C in this partition is always 1. Partition G comprises 8 groups of 18 different 9-bit words C as shown in FIG. 3, which total 144 separate C words and which can be identified by the equation:

$$G = (A_6 + A_5) \cdot (A_1 + A_0). \tag{15}$$

A second partition, H, comprises 8 groups of 6 different 9-bit C words as shown in FIG. 3, which total 48 separate C words, which can be identified by the equation:

$$H = (\bar{A}_6 \cdot \bar{A}_5) \cdot (A_1 + A_0). \tag{16}$$

A third partition, J, comprises 8 groups of 3 different 9-bit C words as shown in FIG. 3, which total 24 separate C words, and which can be identified by the equation:

$$J = (A_5 + A_4) \cdot (\bar{A}_2 \cdot \bar{A}_1 \cdot \bar{A}_0). \tag{17}$$

A fourth partition, K, comprises 6 groups of 3 different 9-bits C words as shown in FIG. 3, which total 18 separate C words and which can be identified by the equation:

$$K = (A_5 + A_4) \cdot [(\bar{A}_3 \cdot A_2 \cdot \bar{A}_1 \cdot \bar{A}_0) + (\bar{A}_6 \cdot A_3 \cdot \bar{A}_2 \cdot \bar{A}_1 \cdot \bar{A}_0)]. \tag{18}$$

A fifth partition, L, comprises 16 individual C words as shown in FIG. 3, which can be identified by the equation:

$$L = (\bar{A}_5 \cdot \bar{A}_4) \cdot (\bar{A}_1 \cdot \bar{A}_0). \tag{19}$$

A sixth partition, M, comprises the remaining 2 groups of 3 9-bit words C, as shown in FIG. 3, which total 6 separate C words and which can be identified by the equation:

$$M = A_6 \cdot (A_5 + A_4) \cdot (A_3 \cdot A_2 \cdot \bar{A}_1 \cdot \bar{A}_0). \tag{20}$$

The Boolean logic equations for 8/9 encoder 32 for encoding data bits $A_7$–$A_0$ into codeword bits $C_8$–$C_0$ based on the table of FIG. 2 are simplified using these partitions, and so the following equations for this encoder are presented utilizing the six partitions equations G, H, J, K, L and M described above in equations 15–20:

$$C_8 = G \cdot A_7 + H \cdot A_7 + J \cdot A_7 + K \cdot A_7 + L + M \tag{21}$$

$$C_7 = G \cdot A_6 + H \cdot A_4 + J + K \cdot (A_6 + A_3) \tag{22}$$

$$C_6 = G \cdot A_5 + H \cdot \bar{A}_4 + J + K \cdot \bar{A}_6 \tag{23}$$

$$C_5 = G \cdot A_4 + H \cdot A_3 + J \cdot A_3 + K + L \cdot A_7 + M \tag{24}$$

$$C_4 = G + L \cdot (\bar{A}_7 + A_6) + M \cdot (A_7 + \bar{A}_5) \tag{25}$$

$$C_3 = G \cdot A_3 + H + J + L \cdot (A_7 \oplus A_6) + M \cdot (A_7 + \bar{A}_5) \tag{26}$$

$$C_2 = G \cdot A_2 + H \cdot A_2 + J \cdot A_6 + K + L \cdot A_3 + M \cdot A_5 \tag{27}$$

$$C_1 = G \cdot A_1 + H \cdot A_1 + J \cdot A_5 + K \cdot A_5 + L + M \tag{28}$$

$$C_0 = G \cdot A_0 + H \cdot A_0 + J \cdot A_4 + K \cdot A_4 + L \cdot A_2 + M \cdot (A_4 \cdot (A_7 + A_5)) \tag{29}$$

Those skilled in the art will recognize that other partitions are possible, that Boolean expressions further reduced, or other equivalent expressions perhaps more conducive to implementing the particular logic gate circuits chosen for use, may be obtained for the present logic expressions described in equations 15–29, and thus, that there are other possible forms for the logic equations (equations 15–29) used in constructing 8/9 encoder 32. As mentioned above, the 9 bits of word C are interleaved with the 8 bits of byte B to form the 17-bit codeword W which is written to and read from the magnetic media in media and head structure 18.

Referring back to FIG. 1, decoder 24 functions to reconstruct the original data bits $A_7$–$A_0$ and $B_7$–$B_0$ from the codeword W signal read from the media in media and structure 18, after this signal is transmitted over the equalized channel to reach Viterbi detector 22. Decoder 24 includes serial parallel converter 50, input latch 52, 9/8 decoder 54, and output latch 56. Input latch 52 separates the interleaved 17 bits of codeword W into 9-bit word C and byte B. Here, 9/8 decoder 54 effectively converts a value of word C represented in a row-column intersection of the table in FIG. 2 to the corresponding value of byte A represented in the corresponding top row digit position and leftmost column digit position. In doing so, 9/8 decoder 54 identifies six partition groupings G, H, J, K, L and M similar to those used in the 8/9 encoder 32 (See FIG. 3 in terms of the location and number of the 9-bit words C in each partition). Each partition group in 9/8 decoder 54 can be expressed as a function of code bits $C_8$–$C_0$ as follows:

$$G = C_4 \cdot (C_7 + C_6) \cdot (C_1 + C_0) \tag{30}$$

$$H = \bar{C}_4 \cdot (C_7 \oplus C_6) \cdot C_3 \cdot (C_1 + C_0) \tag{31}$$

$$J = (C_7 \cdot C_6 \cdot \bar{C}_4) \cdot C_3 \cdot (C_1 + C_0) \tag{32}$$

$$K = (C_7 + C_6) \cdot C_5 \cdot \bar{C}_4 \cdot \bar{C}_3 \cdot C_2 \cdot (C_1 + C_0) \tag{33}$$

$$L = [C_8 \cdot \bar{C}_7 \cdot \bar{C}_6 \cdot (C_5 \oplus C_4) \cdot C_3 \cdot C_1] + (C_8 \cdot \bar{C}_7 \cdot \bar{C}_6 \cdot C_4 \cdot \bar{C}_3 \cdot C_1) \quad (34)$$

$$M = C_8 \cdot \bar{C}_7 \cdot \bar{C}_6 \cdot C_5 \cdot C_1 \cdot [(\bar{C}_4 \cdot \bar{C}_3 \cdot C_2) + (C_4 \cdot C_3)] \quad (35)$$

The Boolean logic equations for 9/8 decoder 54 for decoding code bits $C_8$-$C_0$ into data bits $A_7$-$A_0$ are given by the following equations utilizing the six partition equations G, H, J, K, L and M described above in equations 30–35:

$$A_7 = G \cdot C_8 + H \cdot C_8 + J \cdot C_8 + K \cdot C_8 + L \cdot C_5 + M \cdot C_4 \cdot (C_2 + C_0) \quad (36)$$

$$A_6 = G \cdot C_7 + J \cdot C_2 + K \cdot (C_7 \cdot \bar{C}_6) + L \cdot C_4 \cdot (C_5 + C_3) + M \quad (37)$$

$$A_5 = G \cdot C_6 + J \cdot C_1 + K \cdot C_1 + M \cdot C_2 \quad (38)$$

$$A_4 = G \cdot C_5 + H \cdot C_7 + J \cdot C_0 + K \cdot C_0 + M \cdot (C_0 + \bar{C}_2) \quad (39)$$

$$A_3 = G \cdot C_3 + H \cdot C_5 + J \cdot C_5 + K \cdot (C_7 \cdot C_6) + L \cdot C_2 + M \quad (40)$$

$$A_2 = G \cdot C_2 + H \cdot C_2 + K + L \cdot C_0 + M \quad (41)$$

$$A_1 = G \cdot C_1 + H \cdot C_1 \quad (42)$$

$$A_0 = G \cdot C_0 + H \cdot C_0 \quad (43)$$

Output latch 56 provides as an output the original data bits $A_7$-$A_0$ which were decoded by 9/8 decoder 54, and the data bits $B_7$-$B_0$ which were recovered in input latch 52. Those skilled in the art will recognize that further reductions in the Boolean expressions, or other equivalent expressions more helpful in implementing the logic gate circuits chosen, may be obtained for the present logic expressions described in equations 30–43, and thus, that there are other possible forms for the logic equations (equations 30–43) used for constructing 9/8 decoder gating 54.

Figure 4:
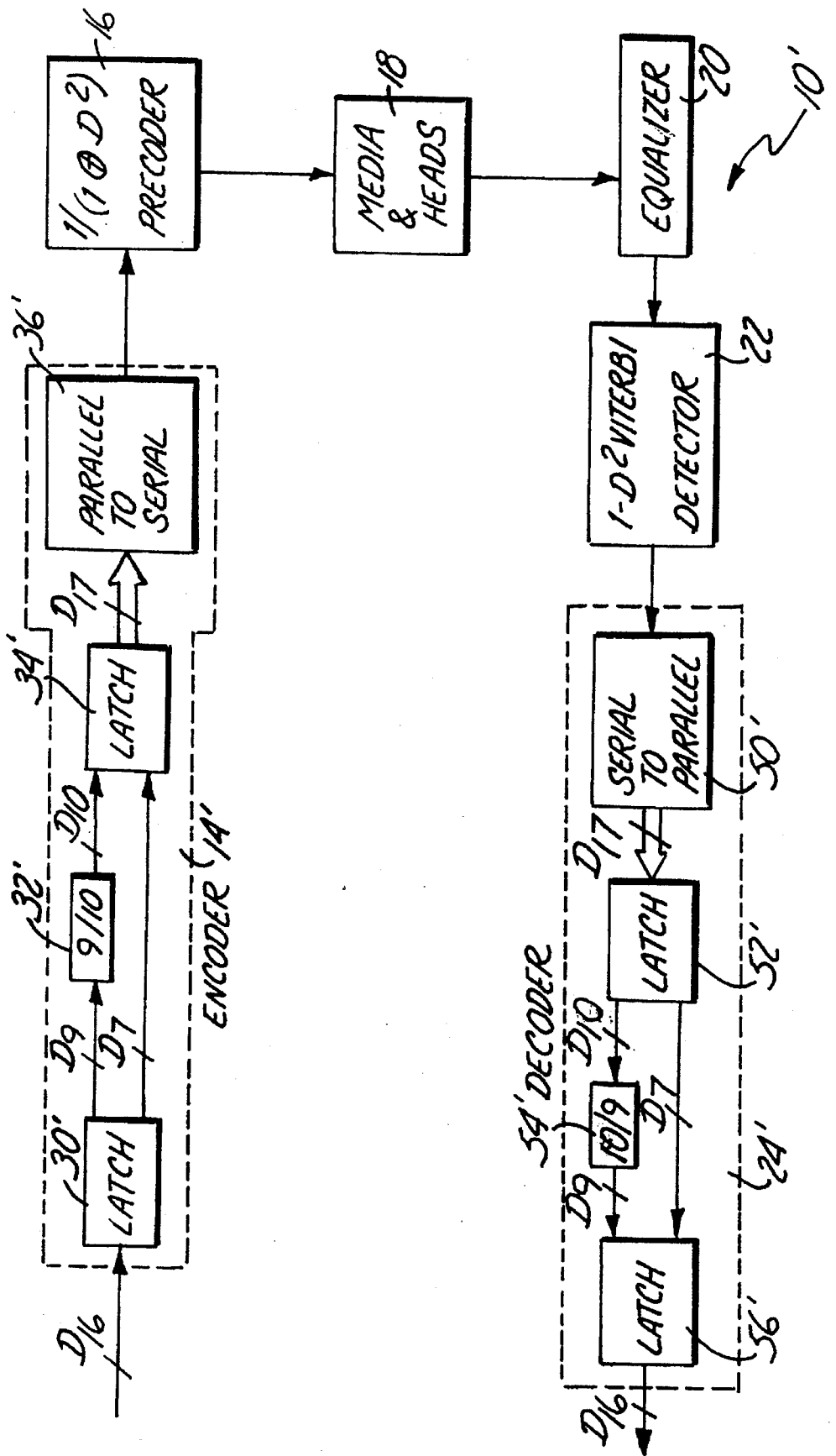
FIG. 4 is a block diagram of a system employing a 16/17 rate RLL code modulation scheme under a (0, 6/6) constraint in accordance with the principals of the present invention.
Figure 6:
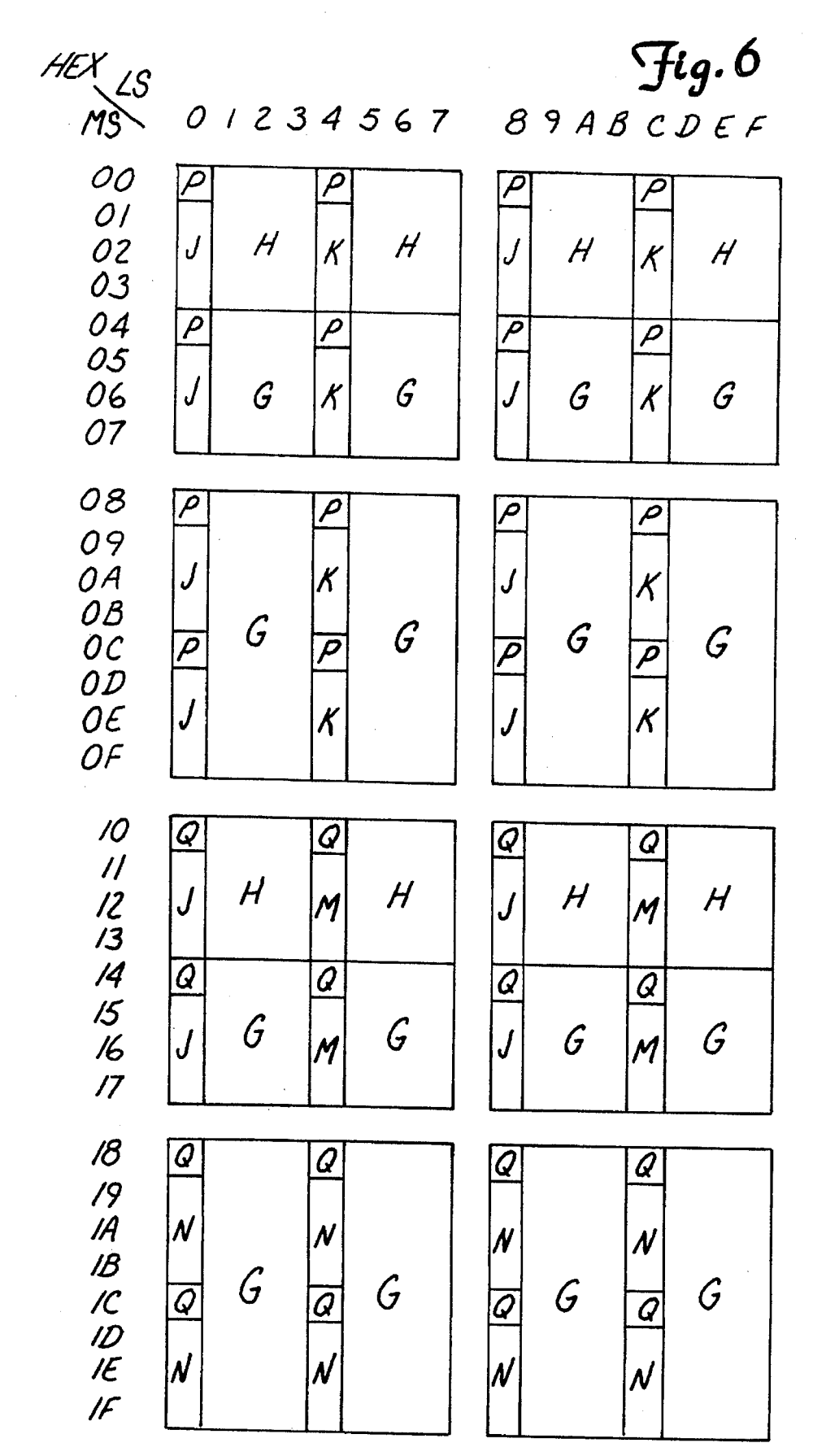

In accordance with another embodiment of the present invention, as illustrated in FIGS. 4–6, there is provided a system 10' utilizing an RLL code having a 16/17 rate and (0, 6/6) overall (d, k, i) constraint which is derived from an RLL code having a 9/10 rate as will be explained below, to provide another way of encoding and decoding received data into a 16/17 RLL rate code again by the method of bit pattern mapping. This rate code has a smaller "k" constraint, compared to the previously described 16/17 rate RLL code with a (0, 8/6) constraint, and is likely to increase update information to the PLO and ACG to thereby provide better performance by system 10', as compared to system 10. Unless otherwise stated, the components hereinafter described with respect to the embodiment illustrated in FIGS. 4–6 are the same as and will operate in the same manner as those components described above with respect to the embodiment illustrated in FIGS. 1–3. Components in FIGS. 4–6 which differ from corresponding ones in FIGS. 1–3 are designated with the same number in FIGS. 4–6 but with a prime symbol placed thereafter. Referring to FIGS. 4–6, encoder 14' is supplied with 16 binary data bit groups as before which are then synchronously entered in latch 30' by the clocking signal where they are treated as being in a first word having 9 bits therein, here denoted A, and a second word having 7 bits therein, here denoted B, wherein:

$$A \triangleq [A_8, A_7, A_6, A_5, A_4, A_3, A_2, A_1, A_0], \quad (44)$$

$$B \triangleq [B_6, B_5, B_4, B_3, B_2, B_1, B_0]. \quad (45)$$

The logic gates in 9/10 encoder 32' perform certain logic functions (given below) on byte A that effectively "maps" that 9-bit word into a 10-bit word, C, wherein:

$$C \triangleq [C_9, C_8, C_7, C_6, C_5, C_4, C_3, C_2, C_1, C_0] \quad (46)$$

following the requirements for the selected overall run length constraint (0, 6/6).

Output latch 34' interleaves word C with 7-bit word B to form a 17-bit codeword W which satisfies the (0,6/6) constraint, and which is denoted as:

$$W \triangleq [C_9, B_6, C_8, B_5, C_7, C_6, B_4, C_5, B_3, C_4, B_2, C_3, B_1, C_2, C_1, B_0, C_0]. \quad (47)$$

Each codeword W includes two subsequences of alternating bits, $W_1$ and $W_2$, wherein the first subsequence $W_1$ consists only of every other bit in a codeword W, and the second subsequence $W_2$ consists of the remaining bits of that codeword W. The first subsequence $W_1$ is denoted as an odd sequence because of having therein the bits from the odd numbered bit positions in codeword W wherein:

$$W_1 \triangleq [C_9, C_8, C_7, B_4, B_3, B_2, B_1, C_1, C_0]. \quad (48)$$

The remaining bits form the second subsequence $W_2$ which is denoted as an even sequence wherein:

$$W_2 \triangleq [B_6, B_5, C_6, C_5, C_4, C_3, C_2, B_0]. \quad (49)$$

In order to ensure that each codeword W satisfies the (0, 6/6) constraint, the maximum number of consecutive zeros within each codeword W, and across the boundary between adjacent codewords W in a sequence thereof, is 6. Again, the maximum number of consecutive zeros within each subsequence $W_1$ and $W_2$, and (a) across the boundary between adjacent subsequences $W_1$ in a sequence thereof, and (b) across the boundary between adjacent subsequences W in a sequence thereof, is 6. Since, again, it is undesirable to constrain the bits of word B (which would also effectively place a constraint on the user system since word B is not being encoded), it is necessary for 9/10 encoder 32' to map word A into word C such that, in the worst case scenario (when word B is all zeros), the codeword W will satisfy the (0, 6/6) constraint mentioned above. Since d=0, the following conditions ensure that the "k" and "i" constraints are satisfied within each codeword and between consecutive codewords:

$$C_9 + C_8 + C_7 = 1 \quad (50)$$

$$C_1 + C_0 = 1 \quad (51)$$

$$C_8 + C_7 + C_6 + C_5 = 1 \quad (52)$$

$$C_7 + C_6 + C_5 + C_4 = 1 \quad (53)$$

$$C_4 + C_3 + C_2 + C_1 = 1 \quad (54)$$

$$C_5 + C_4 + C_3 = 1 \quad (55)$$

$$C_8 + C_7 + C_1 = 1 \quad (56)$$

Equations 50 and 51 above ensure that the k=6 constraint is satisfied at the boundary between codeword W and codewords adjacent thereto since a 1 value for any of $C_9$, $C_8$, and $C_7$ of a codeword $W_n$ and bits $C_1$ and $C_0$ of codeword $W_{n\pm1}$ (see equation 47 above) effectively limits the length of a string of zeros possible over any 6 consecutive bits (assuming the worst case scenario where word B is zero) across the boundary between codeword $W_n$ and either of adjacent codewords $W_{n\pm 1}$. Equations 52±55 ensure that within each codeword W the k=6 constraint is satisfied, since a 1 value of any of bits $C_8$, $C_7$, $C_6$, $C_5$, $C_4$, $C_3$, $C_2$ and $C_1$ of codeword W (equation 47) effectively limits the length of a string of zeros possible over any 6 consecutive bits (assuming the worst scenario where word B is al zeros) within that codeword. Equation 54, in combination with equations 50 and 51, ensures that within each odd subsequence $W_1$ and each even subsequence $W_2$, and at the boundary between each successive pair of odd subsequence $W_1$, and between each successive pair of even subsequence $W_2$, the i=6 constraint is satisfied, since, a 1 value for any of bits $C_9$, $C_8$, $C_7$, $C_1$ and $C_0$ of a codeword W effectively limits the length of a string of zeros possible over any 6 consecutive bits within such subsequences, and over any 6 consecutive bits bridging across the boundary between an odd subsequence $W_{1:n}$ and the subsequences $W_{1:n\pm 1}$ adjacent thereto, and between an even subsequence $W_{2:n}$ and the subsequences $W_{2:n\pm 1}$ adjacent thereto.

There are 524 different 10-bit patterns which satisfy the conditions in equations 50–56, which is more than the necessary number of 512 (i.e. $2^9$) for all possible 9-bit patterns. FIGS. 5A and 5B show a table representing a one-to-one mapping of any possible value of a 9-bit word A, taken as a three digit hexadecimal number, into the corresponding 10-bit word C, taken as a three digit hexadecimal number, such that equations 50–56 are satisfied. The bit patterns are shown in hexadecimal form in FIG. 4 for simplicity with the least significant (LS) digit in the word A hexadecimal number represented in the top line and the two most significant (MS) digits represented in the leftmost column of the table of FIGS. 5A and 5B.

In order to simplify the implementations of 9/10 encoder 32', the 512 different values for 10-bit initial words C shown in the table of FIGS. 5A and 5B can be grouped into eight partitions thereof, G, H, J, K, L, M, P and Q, as shown in FIG. 6 among possible partitioning schemes. In other words, FIG. 6 is a diagram of the table of FIGS. 5A and 5B in which the various partitions denoted by one of the capital letters G, H, J, K, L, M, N, P and Q represent groups of 10-bit C words having a predetermined relationship to each other described below. All of the definitions of the logic structure of 9/10 encoder 32' can again be expressed in Boolean logic expressions wherein "·" denotes an AND gate, "+" denotes an OR gate, $\oplus$ denotes as exclusive OR gate, and "¯" denotes a NOT gate.

Referring to FIG. 6, eight partitions of word assignments are identified by Boolean logic expressions as follows:

$$G = (A_7 + A_6) \cdot (A_1 + A_0) \tag{57}$$

$$H = (\bar{A}_7 \cdot \bar{A}_6) \cdot (A_1 + A_0) \tag{58}$$

$$J = (A_5 + A_4) \cdot (\bar{A}_2 \cdot \bar{A}_1 \cdot \bar{A}_0) \cdot (\bar{A}_8 + \bar{A}_7) \tag{59}$$

$$K = \bar{A}_8 \cdot (A_5 + A_4) \cdot (A_2 \cdot \bar{A}_1 \cdot \bar{A}_0) \tag{60}$$

$$M = A_8 \cdot \bar{A}_7 \cdot (A_5 + A_4) \cdot A_2 \cdot \bar{A}_1 \cdot \bar{A}_0 \tag{61}$$

$$N = A_8 \cdot A_7 \cdot (A_5 + A_4) \cdot \bar{A}_1 \cdot \bar{A}_0 \tag{62}$$

$$P = \bar{A}_8 \cdot (\bar{A}_5 \cdot \bar{A}_4) \cdot (\bar{A}_1 \cdot \bar{A}_0) \tag{63}$$

$$Q = A_8 \cdot (\bar{A}_5 \cdot \bar{A}_4) \cdot (\bar{A}_1 \cdot \bar{A}_0) \tag{64}$$

The logical equations for 9/10 encoder 32' for encoding data bits $A_8$-$A_0$ into word bits $C_9$-$C_0$ are given by the following equations utilizing the eight partitions equations G, H, J, K, L, M, N, P and Q described above in equations 57–64:

$$C_9 = G \cdot A_8 + H \cdot A_8 + J \cdot A_3 + K \cdot A_3 + M \cdot A_3 + N + P \cdot A_3 + Q \tag{65}$$

$$C_8 = G \cdot A_7 + H \cdot A_5 + J + K \cdot A_7 + M + P \tag{66}$$

$$C_7 = G \cdot A_6 + H + K + P \cdot A_7 \tag{67}$$

$$C_6 = G \cdot A_5 + H \cdot A_4 + J \cdot (A_8 + A_7) + K \cdot A_6 + M \cdot A_6 + N \cdot (A_6 + (A_5 \cdot A_4)) + P \cdot A_6 + Q \tag{68}$$

$$C_5 = G \cdot A_4 + H \cdot A_3 + J \cdot \bar{A}_7 + K + M + N \cdot [A_6 \cdot A_5 + (\bar{A}_6 \cdot (\bar{A}_5 + \bar{A}_4))] + P + Q \tag{69}$$

$$C_4 = G + N \cdot (A_6 \cdot A_4 + \bar{A}_6 \cdot \bar{A}_4) + Q \cdot A_6 \tag{70}$$

$$C_3 = G \cdot A_3 + H + J + N \tag{71}$$

$$C_2 = G \cdot A_2 + H \cdot A_2 + J \cdot A_6 + K + M + N \cdot A_3 + Q \cdot A_3 \tag{72}$$

$$C_1 = G \cdot A_1 + H \cdot A_1 + J \cdot A_5 + K \cdot A_5 + M \cdot A_5 + N + P + Q \tag{73}$$

$$C_0 = G \cdot A_0 + H \cdot A_0 + J \cdot A_4 + K \cdot A_4 + M \cdot A_4 + N \cdot A_2 + P \cdot A_2 + Q \cdot A_2 \tag{74}$$

Referring to FIG. 4, decoder 24' functions to reconstruct the original data bits $A_8$-$A_0$ and $B_6$-$B_0$ from the codewords $W_n$. Decoder logic gating 24' identifies the same partition groups as those used in the encoder (see FIG. 6). Each partition group in 10/9 decoder 54' can be expressed as a function of code bits $C_9$-$C_0$ as follows:

$$G = [\bar{C}_8 \cdot (C_7 \cdot C_4) + C_8 \cdot C_4] \cdot (C_1 + C_0) \tag{75}$$

$$H = (C_7 \cdot \bar{C}_4) \cdot C_3 \cdot (C_1 + C_0) \tag{76}$$

$$J = C_8 \cdot (\bar{C}_7 \cdot \bar{C}_4 \cdot (C_6 + C_5)) \cdot C_3 \cdot (C_1 + C_0) \tag{77}$$

$$K = (C_7 \cdot C_5 \cdot \bar{C}_4) \cdot (\bar{C}_3 \cdot C_2 \cdot (C_1 + C_0)) \tag{78}$$

$$M = C_8 \cdot (\bar{C}_7 \cdot \bar{C}_4 \cdot C_5) \cdot \bar{C}_3 \cdot C_2 \cdot (C_1 + C_0) \tag{79}$$

$$N = C_9 \cdot \bar{C}_8 \cdot \bar{C}_7 \cdot (C_6 + C_5) \cdot C_3 \cdot C_1 \tag{80}$$

$$P = C_8 \cdot (C_5 \cdot \bar{C}_4) \cdot (\bar{C}_3 \cdot \bar{C}_2 \cdot C_1) \tag{81}$$

$$Q = C_9 \cdot \bar{C}_8 \cdot (\bar{C}_7 \cdot C_5) \cdot (\bar{C}_3 \cdot C_1) \tag{82}$$

The Boolean logic equations for 10/9 decoder 54' for decoding code bits $C_9$-$C_0$ into data bits $A_7$-$A_0$ are given by the following equations utilizing the eight partition equations G, H, I, J. K, L and M described above in equations 75–82:

$$A_8 = G \cdot C_9 + H \cdot C_9 + J \cdot (C_6 \cdot C_5) + M + N + Q \tag{83}$$

$$A_7 = G \cdot C_8 + J \cdot (C_6 \cdot \bar{C}_5) + K \cdot C_8 + N + P \cdot C_7 + Q \cdot C_6 \tag{84}$$

$$A_6 = G \cdot C_7 + J \cdot C_2 + K \cdot C_6 + M \cdot C_6 + N \cdot C_6 \cdot (C_5 + C_4) + P \cdot C_6 + Q \cdot C_4 \tag{85}$$

$$A_5 = G \cdot C_6 + H \cdot C_8 + J \cdot C_1 + K \cdot C_1 + M \cdot C_1 + N \cdot [(\bar{C}_6 \cdot C_5 \cdot C_4) + C_6 \cdot (C_5 + \bar{C}_5 \cdot \bar{C}_4)] \tag{86}$$

$$A_4 = G \cdot C_5 + H \cdot C_6 + J \cdot C_0 + K \cdot C_0 + M \cdot C_0 + N \cdot [(C_6 \cdot (\bar{C}_5 + C_5 \cdot C_4)) + (\bar{C}_6 \cdot C_5 \cdot \bar{C}_4)] \tag{87}$$

$$A_3 = G \cdot C_3 + H \cdot C_5 + J \cdot C_9 + K \cdot C_9 + M \cdot C_9 + N \cdot C_2 + P \cdot C_9 + Q \cdot C_2 \tag{88}$$

$$A_2 = G \cdot C_2 + H \cdot C_2 + K + M + N \cdot C_0 + P \cdot C_0 + Q \cdot C_0 \tag{89}$$

$$A_1 = G \cdot C_1 + H \cdot C_1 \tag{90}$$

$$A_0 = G \cdot C_0 + H \cdot C_0 \tag{91}$$

Those skilled in the art will recognize that other partitions may be chosen, and that further reduced Boolean expressions or other equivalent expressions, may be obtained from the present logic expressions described in equations 57–91, and thus that there are other possible logic equations for both 9/10 encoder 32' and 10/9 decoder 54'.

Although the present invention has been described with reference to preferred embodiments involving a 16/17 rate RLL code under a (0, 8/6) constraint and a 16/17 rate RLL code under a (0, 6/6) constraint, workers skilled in the art will recognize that changes may be made in form and detail without departing from the spirit and scope of the invention.

What is claimed is:

1. An apparatus for encoding segments having a selected number of ordered bits of binary data, from a sequence of ordered bits of binary data into corresponding codewords, having a selected number of ordered bits of binary data, such that the sequence of ordered bits of binary data is encoded into a corresponding sequence of codewords, the apparatus comprising:

receiver means for receiving the segments;

separating means for separating the selected number of ordered bits of binary data of each segment into a corresponding first group and a corresponding second group;

encoder mapping means for mapping each first group into a corresponding word having a selected number of ordered bits of binary data; and interleaving means for interleaving the bits of each corresponding second group with the selected number of ordered bits of binary data of each corresponding word to obtain codewords corresponding to the segments, such that (a) each codeword has no more than a first preselected number of consecutive zeros therein, (b) adjacent codewords in the sequence of codewords have no more than the first preselected number of consecutive zeros across the boundary therebetween, (c) each codeword comprises two subsequences, one subsequence consisting only of every other bit of the selected number of ordered bits of binary data of the codeword and another subsequence consisting only of the remaining bits with each of the subsequences having no more than a second preselected number of consecutive zeros therein, and (d) adjacent subsequences of codewords within the sequence of codewords have no more that the second preselected number of zeros across the boundary therebetween.

2. The apparatus as in claim 1, wherein the first and second preselected number of consecutive zeros is six.

3. The apparatus as in claim 1, wherein the first preselected number of consecutive zeros is eight and the second preselected number of zeros is six.

4. The apparatus as in claim 1, wherein the ratio of the selected number of bits of binary data in each segment to the selected number of ordered bits of binary data in each corresponding codeword is 16/17.

5. The apparatus as in claim 1, wherein the selected number of bits of binary data in the first and second groups is eight.

6. The apparatus as in claim 5, wherein the encoder mapping means maps the first group of eight bits of binary data into words having nine bits of binary data.

7. The apparatus as in claim 1, wherein the selected number of bits in the first group is nine and wherein the selected number of bits in the second group is seven.

8. The apparatus as in claim 7, wherein the encoder mapping means maps the first group of nine bits of binary data into words having ten bits of binary data.

9. The apparatus as in claim 1, further comprising decoder means for decoding a selected number of codewords into a selected number of bits of binary data.

10. The apparatus as in claim 9, wherein the decoder means comprises:

receiver means for receiving the sequence of codewords;

decoder separating means for separating the selected number of ordered bits of binary data of each codeword back into the corresponding word and into the second group; and decoder mapping means for mapping each corresponding word back into the first group; such that the corresponding segment is formed.

11. A method for encoding a segments having a selected number of ordered bits of binary data, from a sequence of ordered bits of binary data into corresponding codewords, having a selected number of ordered bits of binary data, such that the sequence of ordered bits of binary data is encoded into a sequence of codewords, the method comprising:

receiving the segments;

separating the selected number of ordered bits of binary data of each segment into a corresponding first group and a corresponding second group;

mapping each first group into a corresponding word having a selected number of ordered bits of binary data; and interleaving the bits of each corresponding second group with the selected number of ordered bits of binary data of each corresponding word to obtain codewords corresponding to the segments, such that (a) each codeword has no more than a first preselected number of consecutive zeros therein, (b) adjacent codewords in the sequence of codewords have no more than the first preselected number of consecutive zeros therebetween, (c) each codeword comprises two subsequences, one subsequence consisting only of every other bit of the selected number of ordered bits of binary data of the codeword and another subsequence consisting only of the remaining bits with each of the subsequences having no more than a second preselected number of consecutive zeros therein, and (d) adjacent subsequences of codewords within the sequence of codewords have no more that the second preselected number of zeros across the boundary therebetween.

12. The method as in claim 11, wherein the first and second preselected number of consecutive zeros is six.

13. The method as in claim 11, wherein the first preselected number of consecutive zeros is eight and the second preselected number of zeros is six.

14. The method as in claim 11, wherein the ratio of the selected number of bits of binary data of each segment to the selected number of ordered bits of binary data in each codeword is 16/17.

15. The method as in claim 11, wherein the selected number of bits of binary data in the first and second groups is eight.

16. The method as in claim 15, wherein the first group of eight bits of binary data is mapped into words having nine bits of binary data.

17. The method as in claim 11, wherein the selected number of bits in the first group is nine and wherein the selected number of bits in the second group is seven.

18. The method as in claim 17, wherein the first group of nine bits of binary data is mapped into words having ten bits of binary data.

19. The method as in claim 11, further comprising the step of decoding a selected number of codewords into a selected number of bits of binary data.

20. The method as in claim 19, wherein the step of decoding further comprises:

receiving the sequence of codewords;

separating the selected number of ordered bits of binary data of each codeword back into the word having a selected number of ordered bits of binary data and back into the second group of the selected number of bits of binary data; and mapping the first group of selected the word back into the first group of the selected number of bits of binary data.

* * * * *

UNITED STATES PATENT AND TRADEMARK OFFICE
CERTIFICATE OF CORRECTION

PATENT NO. : 5,537,112
DATED : July 16, 1996
INVENTOR(S) : KINHING TSANG

It is certified that error appears in the above-indentified patent and that said Letters Patent is hereby corrected as shown below:

Col. 6, line 42, delete "$C_s$,", insert --$C_5$.--

Col. 7, line 28, delete "「"」", insert --"¯"--

Col. 7, line 56, delete "$A_i$", insert --$\overline{A}_1$--

Col. 11, line 45, delete "「"」", insert --"¯"--

Col. 12, line 4, after "$A_6$+" delete "Q(68)" insert --Q·$A_7$(68)--

Col. 12, line 33, "$C_4$(85)" should read --$\overline{C}_4$)] (86)

Col. 12, line 34, "$C_4$·(87)" should read --$\overline{C}_4$)] (87)--

Signed and Sealed this

Seventh Day of January, 1997

Attest:

BRUCE LEHMAN

*Attesting Officer*     *Commissioner of Patents and Trademarks*